US005500560A

United States Patent [19]

Kano

[11] Patent Number: 5,500,560
[45] Date of Patent: Mar. 19, 1996

[54] SEMICONDUCTOR DEVICE HAVING LOW RESISTANCE VALUES AT CONNECTION POINTS OF CONDUCTOR LAYERS

[75] Inventor: Isao Kano, Tokyo, Japan

[73] Assignee: NEC Corporation, Tokyo, Japan

[21] Appl. No.: 974,719

[22] Filed: Nov. 12, 1992

[30] Foreign Application Priority Data

Nov. 12, 1991 [JP] Japan .................................. 3-295319

[51] Int. Cl.⁶ ........................... H01L 23/48; H01L 23/52; H01L 29/40
[52] U.S. Cl. ........................... 257/767; 257/758; 257/752
[58] Field of Search ........................... 257/769, 768, 257/764, 763, 758, 774, 750, 767, 770, 751

[56] References Cited

U.S. PATENT DOCUMENTS

| 3,808,041 | 4/1974 | Rosenberger et al. | 117/217 |
| 3,926,747 | 12/1975 | Newby et al. | 204/15 |
| 4,121,241 | 10/1978 | Drake et al. | 257/767 |
| 4,755,480 | 7/1988 | Yau et al. | 257/770 |
| 4,872,050 | 10/1989 | Okamoto et al. | 357/71 |
| 5,049,975 | 9/1991 | Ajika et al. | 257/770 |

FOREIGN PATENT DOCUMENTS

| 58-137231 | 8/1983 | Japan . | |
| 2200764 | 9/1987 | Japan | 257/763 |
| 345835 | 2/1988 | Japan | 257/763 |
| 01270347 | 10/1989 | Japan | 257/755 |
| 01255249 | 10/1989 | Japan | 257/768 |
| 39524 | 1/1991 | Japan | 257/758 |
| 03250627 | 11/1991 | Japan | 257/767 |
| 04116953 | 4/1992 | Japan | 257/751 |

Primary Examiner—Rolf Hille
Assistant Examiner—T. M. Arroyo
Attorney, Agent, or Firm—Burns, Doane, Swecker & Mathis

[57] ABSTRACT

In a semiconductor device having a first conductor layer (25) formed on a first insulator layer (23) and a second insulator layer (29) formed on the first conductor layer, a second conductor layer (31) has a primary conductor film (35) formed on the second insulator layer, a secondary conductor film (37) formed on the primary conductor film, and a ternary conductor film (63) formed on the secondary conductor film. The second insulator layer has a recessed surface (29b) which defines a contact perforation exposing a predetermined area of an upper surface (25a) of the first conductor layer. The secondary conductor film is further formed on the recessed surface and the predetermined area. The primary conductor film has a primary resistance value. The secondary conductor film has a secondary resistance value which is lower than the primary resistance value.

14 Claims, 7 Drawing Sheets

SEMICONDUCTOR DEVICE HAVING LOW RESISTANCE VALUES AT CONNECTION POINTS OF CONDUCTOR LAYERS

BACKGROUND OF THE INVENTION

This invention relates to a semiconductor device having a plurality of conductor layers.

In the manner which will later be described more in detail, a conventional semiconductor device comprises a semiconductor substrate, a first insulator layer, a first conductor layer, a second insulator layer, and a second conductor layer. The semiconductor substrate has a principal surface. The first insulator layer overlies the principal surface and has a first upper insulator surface. The first conductor layer overlies the first upper insulator surface and has a first upper conductor surface leaving a surrounding area of the first upper insulator surface. The second insulator layer overlies the first upper conductor surface and the surrounding area and has a second upper insulator surface. The second insulator layer has a recessed surface which defines a contact perforation exposing a predetermined area of said first upper conductor surface. The second conductor layer comprises a primary conductor film and a secondary conductor film. The primary conductor film overlies the second insulator surface, the recessed surface in a predetermined area and has a primary upper surface. The secondary conductor film overlies the primary upper surface.

The secondary conductor film is connected to the first conductor layer through the primary conductor film. The primary conductor film has a first resistance value which is high. Consequently, a resistance value at a connection point of the first and the second conductor layers is high.

Another conventional semiconductor device is disclosed in Japanese Unexamined Patent Prepublication (Kokai) No. 137231/1983. This conventional semiconductor device comprises a semiconductor substrate, a first insulator layer, a first conductor layer, a second insulator layer, and a second conductor layer. The semiconductor substrate has a principal surface. The first insulator layer overlies the principal surface and has a first upper insulator surface. The first conductor layer overlies the first upper insulator surface and has a first upper conductor surface leaving a surrounding area of the first upper insulator surface. The second insulator layer overlies the first upper conductor surface and the surrounding area and has a second upper insulator surface. The second insulator layer has a first recessed surface which defines a first contact perforation exposing a predetermined area of the first upper conductor surface. The second conductor layer comprises a primary conductor film and a secondary conductor film. The primary conductor film overlies a second upper insulator surface and has a primary upper surface. The primary conductor film has a second recessed surface which defines a second contact perforation exposing, in combination with the first contact perforation, the predetermined area of the first upper conductor surface. The secondary conductor film overlies the primary upper surface, the first and the second recessed surfaces, and the predetermined area. Namely, the secondary conductor film is directly connected to the first conductor layer. Consequently, a resistance value at a connection point of the first and the second conductor layers is low. It will be assumed that the secondary film is made of gold. In this event, the secondary film can not be formed on the second recessed surface by electroplating without a conductor film on the second recessed surface.

SUMMARY OF THE INVENTION

It is therefore an object of the present invention to provide a semiconductor device which has a low resistance value at a connection point of first and second conductor layers.

Other objects of this invention will become clear as the description proceeds.

According to an aspect of this invention, there is provided a semiconductor device which comprises (A) a semiconductor substrate having a principal surface; (B) a first insulator layer overlying the principal surface and having a first upper insulator surface; (C) a first conductor layer overlying the first upper insulator surface and having a first upper conductor surface leaving a surrounding area of the first upper insulator surface; (D) a second insulator layer overlying the first upper conductor surface and the surrounding area of the first upper insulator surface and having a second upper insulator surface, the second insulator layer having a recessed surface which defines a contact perforation exposing a predetermined area of the first upper conductor surface; and (E) a second conductor layer overlying the second upper insulator surface, the recessed surface, and the predetermined area, the second conductor layer comprising a primary conductor film having a primary upper surface, a secondary conductor film having a secondary upper surface, and a ternary conductor film, the primary conductor film overlying the second upper insulator surface, the secondary conductor film overlying the predetermined area, the recessed surface, and the primary upper surface, the ternary conductor film overlying the secondary upper surface, the primary conductor film having a primary resistance value, the secondary conductor film having a secondary resistance value which is lower than the primary resistance value.

According to another aspect of this invention, there is provided a method which is for manufacturing a semiconductor device and which comprises the steps of: (A) preparing a semiconductor substrate having a principal surface; (B) forming a first insulator layer on the principal surface to have a first upper insulator surface; (C) forming a first conductor layer on the first upper insulator surface leaving a surrounding area of the first upper insulator surface, the first conductor layer having a first upper conductor surface; (D) forming a second insulator layer on the first upper conductor surface and the surrounding area of the first upper insulator surface to have a second upper insulator surface; (E) forming in the second insulator layer a first recessed surface which defines a first contact perforation exposing a predetermined area of the first upper conductor surface; and (F) forming a second conductor layer on the second upper insulator surface, the first recessed surface, and the predetermined area; (G) the second conductor layer forming step comprising: (H) forming a primary conductor film on the second upper insulator surface, the first recessed surface, and the predetermined area to have a primary resistance value and a primary upper surface; (I) forming in the primary conductor film to have a second recessed surface which defines a second contact perforation exposing, in combination with the first contact perforation, the predetermined area of the first upper conductor surface; (J) forming a secondary conductor film on the predetermined area, the first and the second recessed surfaces, and the primary upper surface to have a secondary upper surface and a secondary resistance value which is lower than the primary resistance value; and (K) forming a ternary conductor film on the secondary upper surface.

According to a still another aspect of this invention, there is provided a method which is for manufacturing a semiconductor device and which comprises the steps of: (A) preparing a semiconductor substrate having a principal surfacer (B) forming a first insulator layer on the principal surface to have a first upper insulator surface; (C) forming a first conductor layer on the first upper insulator surface leaving a surrounding area of the first upper insulator surface, the first conductor layer having a first upper conductor surface; (D) forming a second insulator layer on the first upper conductor surface and the surrounding area of the first upper insulator surface to have a second upper insulator surface; (E) forming a primary conductor film on the second upper insulator surface to have a primary resistance value and a primary upper surface; (F) forming in the primary conductor film a first recessed surface which defines a first contact perforation; (G) forming in the second insulator layer a second recessed surface which defines a second contact perforation exposing, in combination with the first contact perforation, a predetermined area of the first upper conductor surface; (H) forming a secondary conductor film on the predetermined area, the first and the second recessed surfaces, and the primary upper surface to have a secondary resistance value which is lower than the primary resistance value, the secondary conductor film having a secondary upper surface; and (I) forming a ternary conductor film on the secondary upper surface.

DESCRIPTION OF THE PREFERRED EMBODIMENTS

Figure 1:
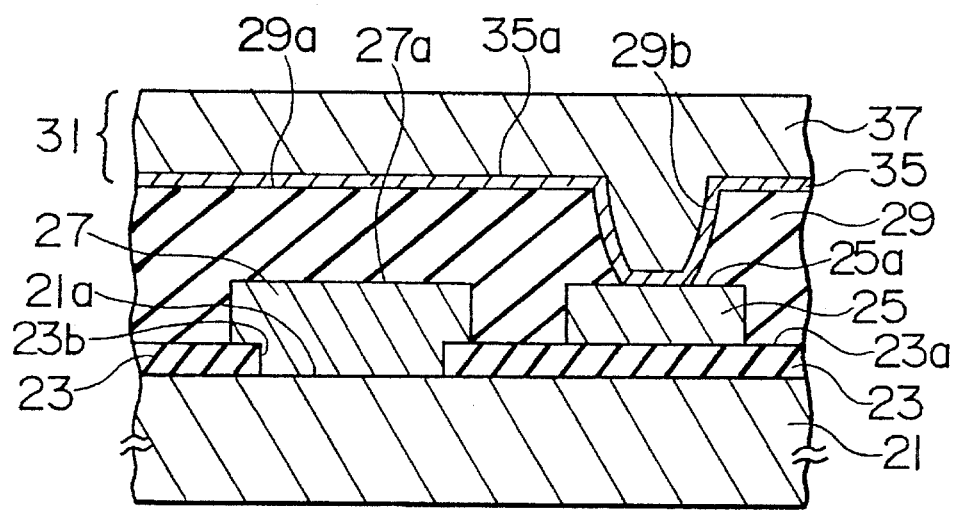
FIG. 1 is a schematic vertical sectional view of a conventional semiconductor device.
Figure 2:
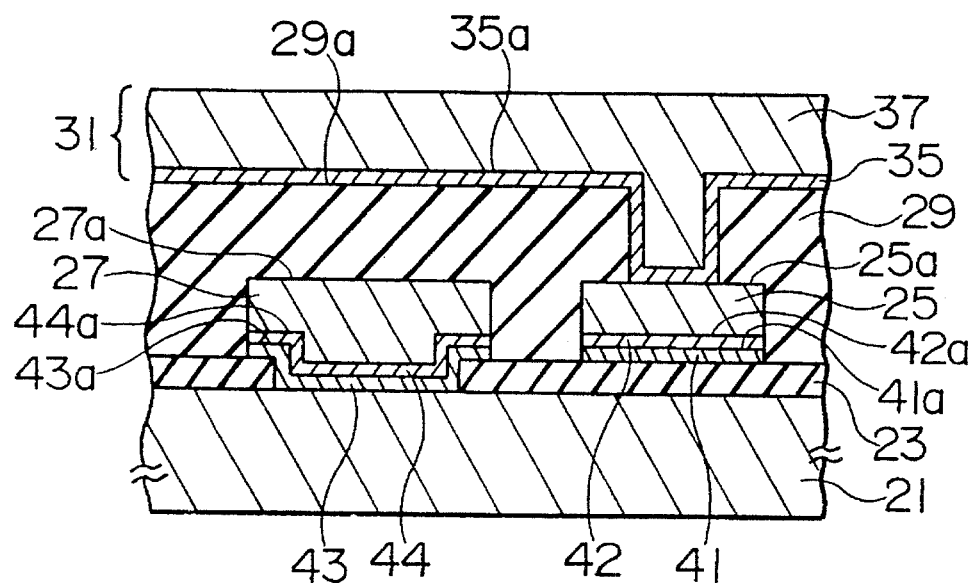
FIG. 2 is a schematic vertical sectional view of another conventional semiconductor device.

Referring to FIGS. 1 and 2, conventional semiconductor devices will first be described for a better understanding of this invention.

In FIG. 1, the conventional semiconductor device comprises a semiconductor substrate 21, a first insulator layer 23, first primary and secondary conductor layers 25 and 27, a second insulator layer 29, and a second conductor layer 31. The semiconductor substrate 21 has a principal surface 21a. The first insulator layer 23 overlies the principal surface 21a and has a first upper insulator surface 23a. The first insulator layer 23 has a first recessed surface 23b which defines a first contact perforation exposing a first predetermined area of the principal surface 21a. The first primary conductor layer 25 overlies the first upper insulator surface 23a and has a first primary upper conductor surface 25a leaving a primary surrounding area of the first upper insulator surface 23a. The first secondary conductor layer 27 overlies the first predetermined area of the principal surface 21a and the first upper insulator surface 23a. The first secondary conductor layer 27 has a first secondary upper conductor surface 27a leaving a secondary surrounding area of the first upper insulator surface 23a.

The second insulator layer 29 overlies the first primary and the first secondary upper conductor surfaces 25a and 27a and the primary and the secondary surrounding areas. The second insulator layer 29 has a second upper insulator surface 29a. The second insulator layer 29 has a second recessed surface 29b which defines a second contact perforation exposing a second predetermined area of the first primary upper conductor surface 25a.

The second conductor layer 31 comprises a primary conductor film 35 and a secondary conductor film 37. The primary conductor film 35 overlies the second upper insulator surface 29a, the second recessed surface 29b, and the second predetermined area of the first primary upper conductor surface 25a. The primary conductor film 35 has a primary upper surface 35a. The secondary conductor film 37 overlies the primary upper surface 35a.

The first primary and the first secondary conductor layers 25 and 27 are made of aluminum, aluminum alloy, or aluminum copper alloy. The primary conductor film 35 is made of titanium or tungsten. The secondary conductor film 37 is made of aluminum or aluminum alloy.

In FIG. 2, another conventional semiconductor device further comprises primary through quaternary films 41, 42, 43, and 44. The primary film 41 overlies the first upper insulator surface 23a and has a primary upper film surface 41a. The secondary film 42 overlies the primary upper film surface 41a and has a secondary upper film surface 42a. The first primary conductor layer 25 overlies the secondary upper film surface 42a. The ternary film 43 overlies the first upper insulator surface 23a and the first predetermined area of the principal surface 21a and has a ternary upper film surface 43a. The quaternary film 44 overlies the ternary upper film surface 43a and has a quaternary upper film surface 44a. The first secondary conductor layer 27 overlies the quaternary upper film surface 44a.

The first primary and the first secondary conductor layers 25 and 27 are made of gold. The primary conductor film 35 is made of titanium tungsten alloy. The secondary conductor film 37 is made of gold. The primary and the ternary conductor films 41 and 43 are made of titanium tungsten alloy. The secondary and the quaternary conductor films 42 and 44 are made of platinum.

As shown in FIGS. 1 and 2, the secondary conductor film 37 is connected to the first primary conductor layer 25 through the primary conductor film 35. The primary conductor film 35 has a primary resistance value which is high. Consequently, a resistance value at a connection point of the first primary conductor layer 25 and the second conductor layer 31 is high.

Figure 3:
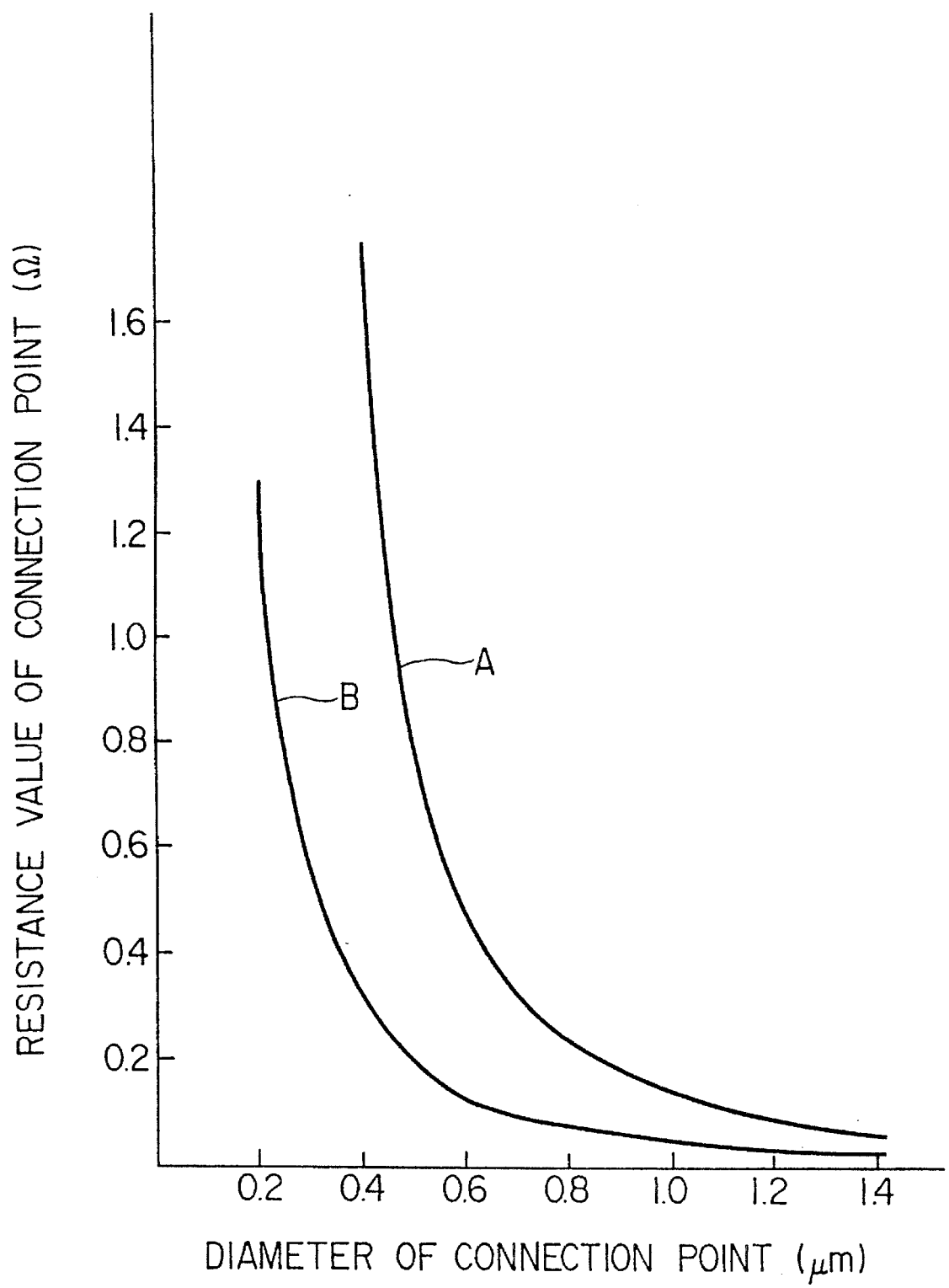
FIG. 3 is a graph for use in describing operation of the conventional semiconductor device illustrated in FIG. 2 and a semiconductor device according to an embodiment of this invention.

Referring to FIG. 3, a first curved line A exemplifies a relation of resistance values in response to diameters at a connection point of the first primary conductor layer 25 and the second conductor layer 31 in the conventional semiconductor device illustrated in FIG. 2. A second curved line B will later be described.

Referring to FIGS. 4(A) to (J), the description will proceed to a method of manufacturing a semiconductor device according to a first embodiment of this invention. Similar parts are designated by like reference numerals.

Figure 4A:
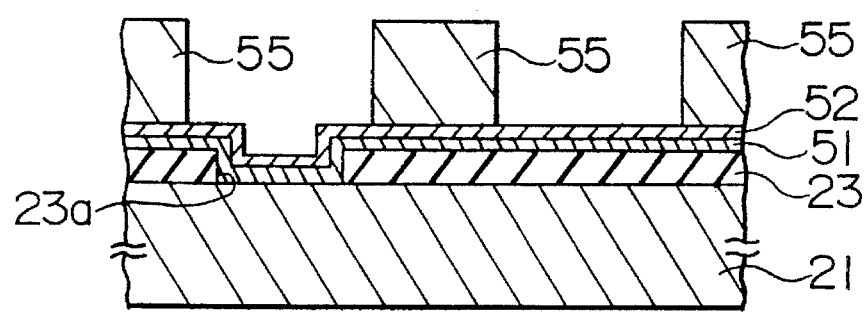
FIG. 4(A) to (J), drawn on four sheets, are schematic vertical sectional views of a semiconductor device at various step of a method according to a first embodiment of this invention.

In FIG. 4(A), the semiconductor substrate 21 was prepared in the known manner to have the principal surface 21a. The semiconductor substrate 21 was made of inorganic semiconductor compound to have diffusion layers (not shown). The first insulator layer 23 was formed on the principal surface 21a to have the first upper insulator surface 23a. The first insulator layer 23 was formed by photo lithography and dry etching to have the first recessed surface 23b which defines the first contact perforation exposing a first predetermined area of the principal surface 21a.

A first film 51 was formed by sputter of titanimum tungsten alloy onto the first upper insulator surface 21a and the first predetermined area to have a first upper surface. A second film 52 was formed by sputter of platinum onto the first upper surface of the first film 51 to have a second upper surface.

Figure 4B:
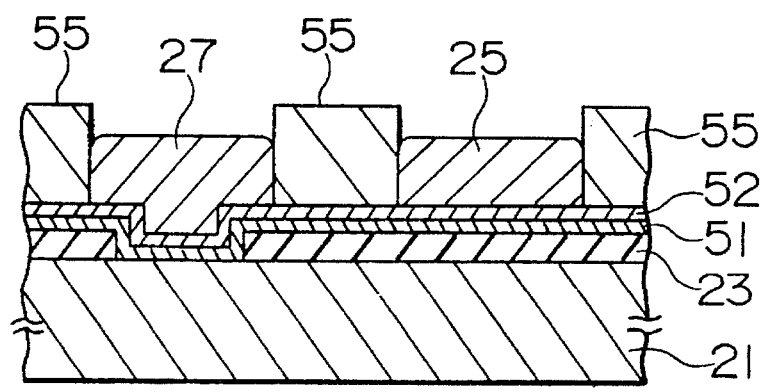

In FIG. 4(B), first-set photo resists 55 were formed by photo lithography on the second upper surface of the second film 52 with a gap left between adjacent two photo resists 55. Each of the first primary and the first secondary conductor layers 25 and 27 was formed by electroplating gold or gold alloy on the second upper surface of the second film 52 between the photo resists 55.

Figure 4C:
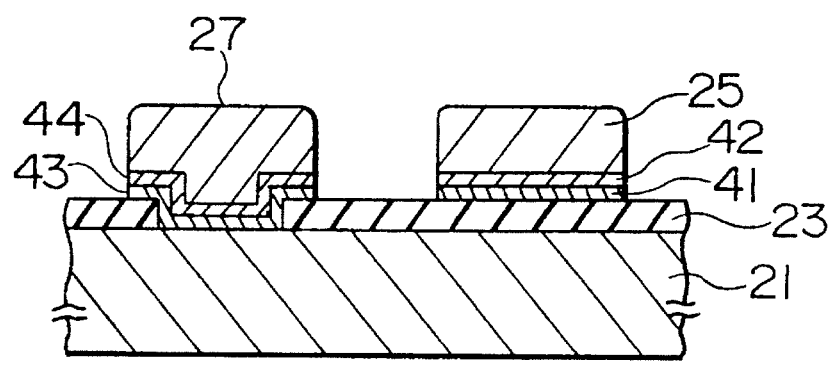

In FIG. 4(C), the photo resists 55 were taken away from the second upper surface of the second film 52. A first predetermined part of the first film 51 and a second predetermined part of the second film 52 were taken away either by wet etching or by sputter etching with the first primary and the first secondary conductor layers 25 and 27 used as masks. As a result, the primary through the quaternary films 41 to 44 and the first primary and the first secondary conductor layers 25 and 27 were formed.

Figure 4D:
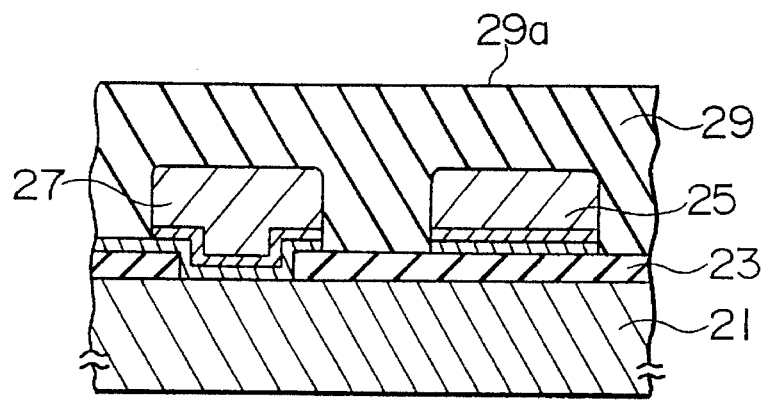

In FIG. 4(D), the second insulator layer 29 was formed on the first primary and the first secondary upper conductor surfaces 25a and 27a and the first upper insulator surface 23a to have the second upper insulator surface 29a. The second insulator layer 29 was formed by plasma CVD (chemical vapor deposition) process of either an oxide film or a nitride film. The second insulator layer 29 may be an inorganic film, such as $Si_xO_yN_z$.

Figure 4E:
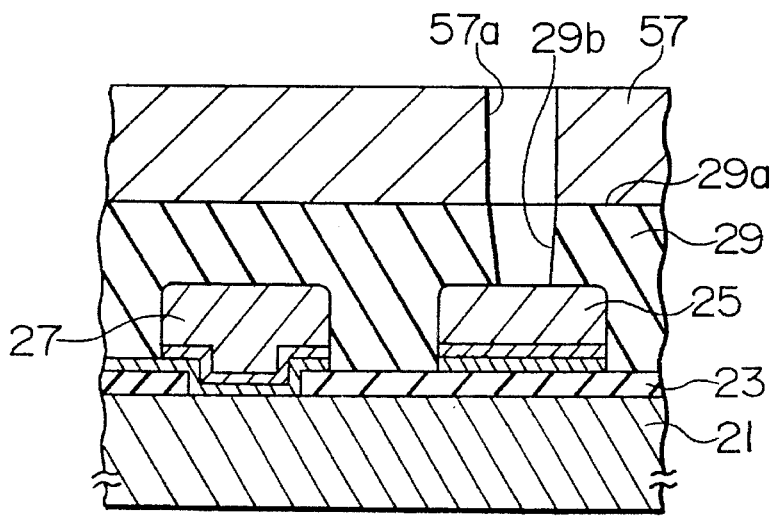

In FIG. 4(E), a second photo resist 57 was formed by photo lithography on the second upper insulator surface 29a to have a first recessed resist surface 57a which defines a perforation exposing a third predetermined area of the second upper insulator surface 29a. The second insulator layer 29 was formed by wet or dry etching with the second photo resist 57 used as a mask to have the second recessed surface 29b which defines the second contact perforation exposing the second predetermined area of the first primary upper conductor surface 25a.

Figure 4F:
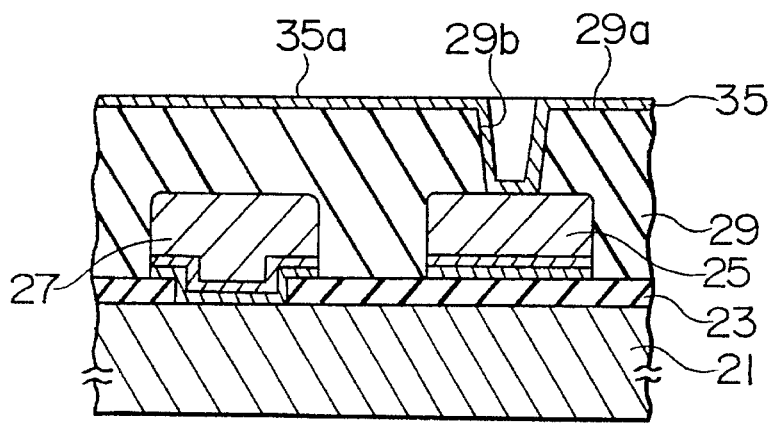

In FIG. 4(F), the primary conductor film 35 was formed on the second upper insulator surface 29a, the second recessed surface 29b, and the second predetermined area of the first primary upper conductor surface 25a to have the primary upper surface 35a. The primary conductor film 35 was formed by sputter of at least one member selected from titanium, tungsten, molybdenum, and titanium nitride. The primary conductor film 35 may be made by sputter of a silicide of at least one member selected from titanium, tungsten, molybdenum, and titanium nitride.

Figure 4G:
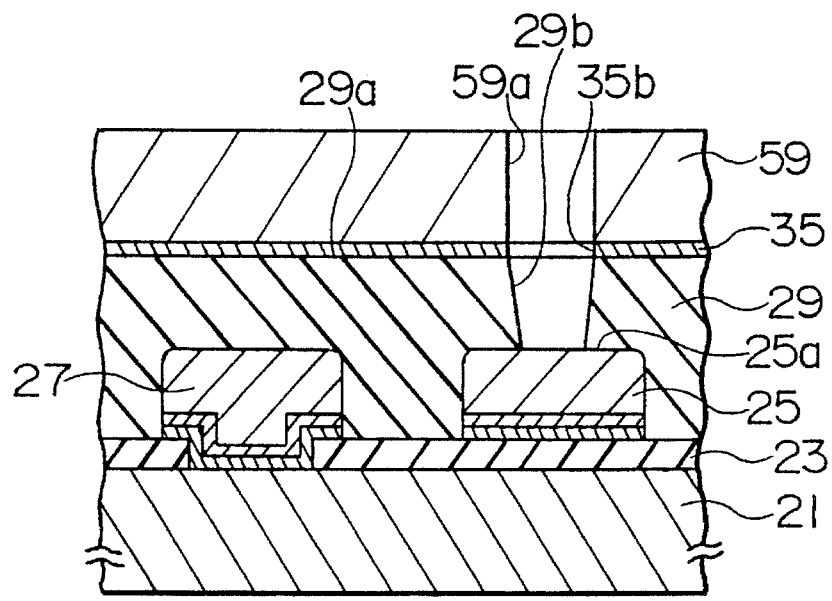

In FIG. 4(G), a third photo resist 59 was formed by photo lithography on the primary upper surface 35a to have a second recessed resist surface 59a which defines the perforation exposing a fourth predetermined area of the primary upper surface 35a. The primary conductor film 35 was formed by wet or dry etching to have the third recessed surface 35b which defines the third contact perforation exposing, in combination with the second recessed surface 29a, the second predetermined area of the first primary upper conductor surface 25a.

Figure 4H:
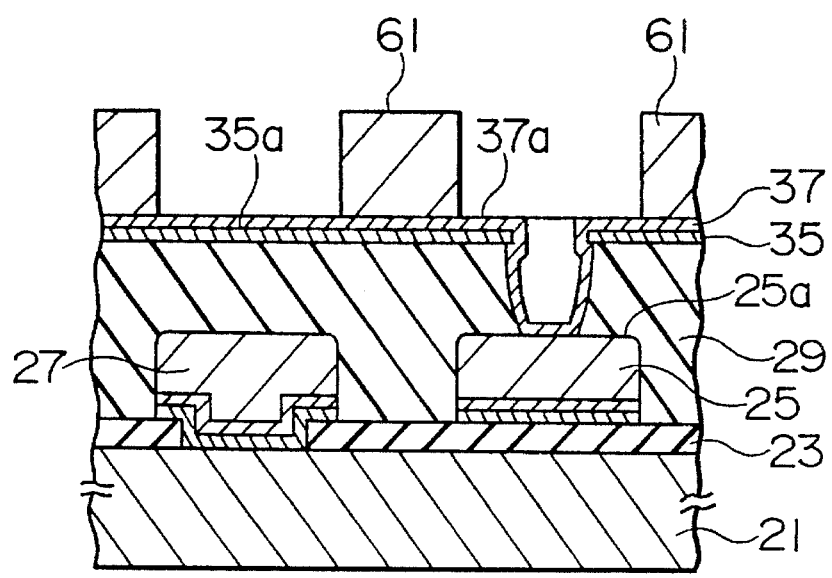

In FIG. 4(H), the secondary conductor film 37 was formed by sputter on the primary upper surface 35a, the second and the third recessed surfaces 29b and 35b, and the second predetermined area of the first primary upper conductor surface 35a. The secondary conductor film 37 was made of a member selected from platinum, palladium, platinum alloy, and palladium alloy. Third-set resists 61 were formed by photo lithography on the secondary upper surface 37a with a gap left between adjacent two photo resists 61.

Figure 4I:
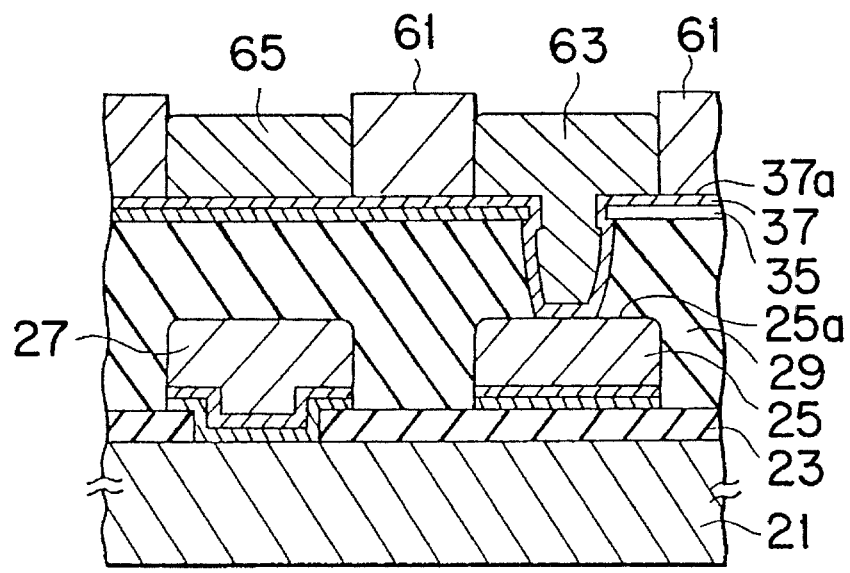

In FIG. 4(I), each of a first ternary conductor film 63 and a second ternary conductor film 65 was formed by electroplating gold on the secondary upper surface 37a between the third-set resists 61.

Figure 4J:
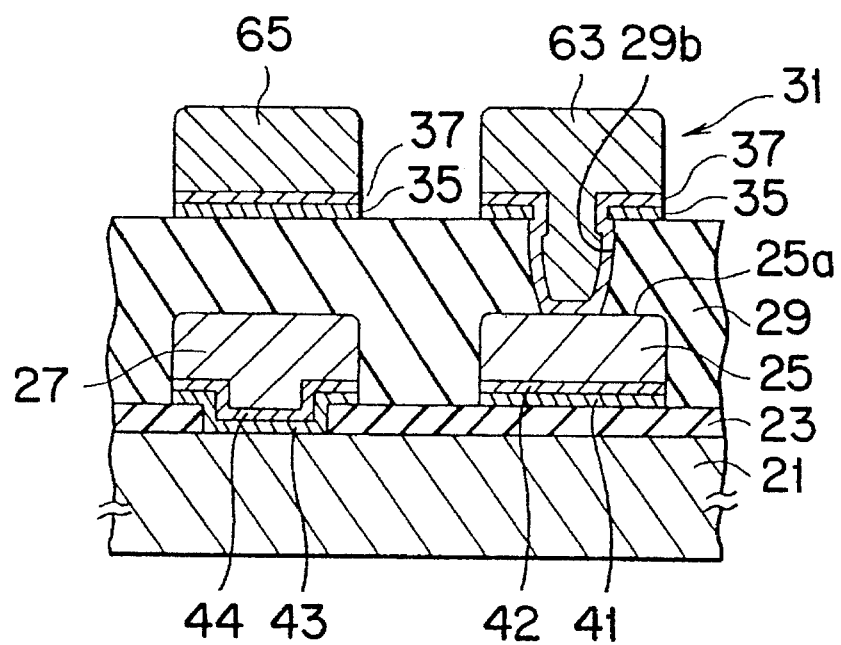

In FIG. 4(J), the third-set resists 61 were taken away from the secondary upper surface 37a. A primary predetermined part of the primary conductor film 35 and a secondary predetermined part of the secondary conductor film 37 were taken away by wet etching or sputter etching with the first ternary conductor film 63 and the second ternary conductor film 65 used as masks.

The second conductor layers 31 comprises the primary conductor film 35, the secondary conductor film 37, and the first ternary conductor film 63. Although not shown, one or more second conductor layer, such as 31, may additionally be formed on the first ternary conductor film 63 in the manner described in connection with FIGS. 4(D) to (J).

Figure 5:
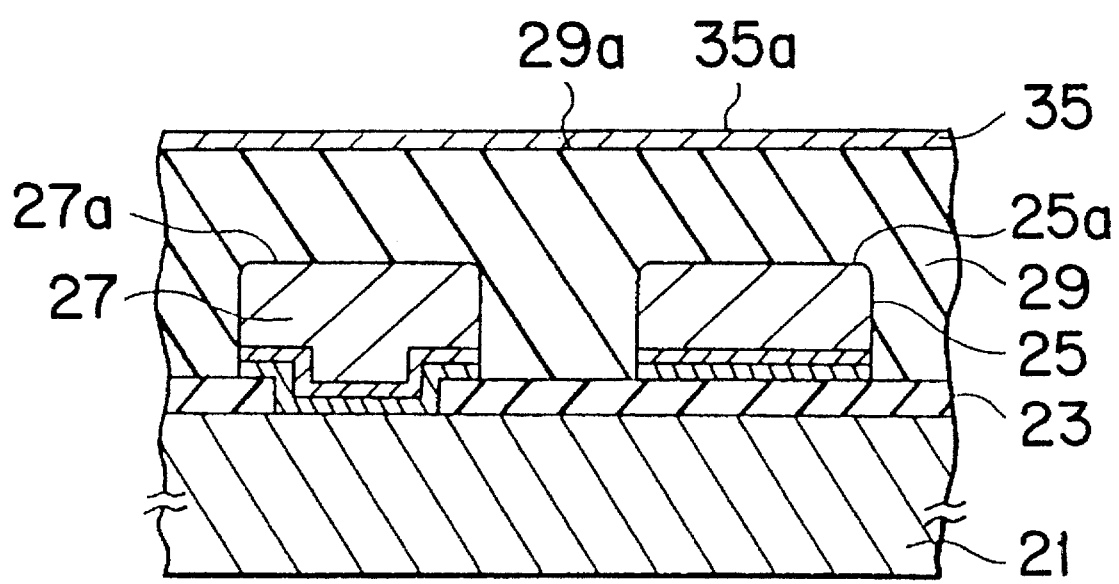
FIG. 5 is a schematic vertical sectional views for explaining a method of manufacturing a semiconductor device according to a second embodiment of this invention.

Referring to FIG. 5, the description will proceed to a method of manufacturing the semiconductor device according to a second embodiment of this invention.

The illustrated semiconductor device is manufactured like the device of FIG. 4 with a process of FIG. 5 carried out instead of processes of FIGS. 4(E) and (F).

In FIG. 5, the primary conductor film 35 was formed on the second insulator surface 29a by sputter of at least one member selected from titanium, tungsten, molybdenum, and titanium nitride. The primary conductor film 35 may be made by sputter of a silicide of at least one member selected from titanium, tungsten, molybdenum, and titanium nitride.

Referring back to FIG. 4(J), the semiconductor substrate 21 has a thickness of 200 to 800 microns. The first insulator layer 23 has a thickness of 0.1 to 1.5 microns. The first primary and the first secondary layers 25 and 27 has a thickness of 0.4 to 1.2 microns. The second insulator layer 29 has a thickness of 1.0 to 1.5 microns. The primary conductor film 35 has a thickness of 0.1 to 0.3 micron. The secondary conductor film 37 has a thickness of 0.01 to 0.03 micron. Each of the first and the second ternary conductor films 63 and 65 has a thickness of 0.4 to 1.2 microns. Each of the primary and the ternary films 41 and 43 has a thickness of 0.03 to 0.2 micron. Each of the secondary and the quaternary films 42 and 44 has a thickness of 0.03 to 0.1 micron.

The primary conductor film 35 has a primary resistance value. The secondary conductor film 37 has a secondary resistance value which is lower than the primary resistance value.

Referring back to FIG. 3, the second curved line B exemplifies a relation of resistance values in response to diameters at a connection point Of the first primary conductor layer 25 and the second conductor layer 31 in the semiconductor device eventually attained at the step illustrated in FIG. 4(J). The connection point of the first primary conductor layer 25 and the second conductor layer 31 is the secondary conductor film 35 and the first ternary conductor film 37 in the second contact perforation which is defined by the second recessed surface 29a.

What is claimed is:

1. A semiconductor device comprising:

a semiconductor substrate having a principal surface;

a first insulator layer overlying said principal surface and having a first upper insulator surface;

a first conductor layer overlying said first upper insulator surface and having a first upper conductor surface leaving a surrounding area of said first upper insulator surface exposed;

a second insulator layer overlying said first upper conductor surface and said surrounding area of the first upper insulator surface and having a second upper insulator surface, said second insulator layer having a recessed surface which defines a contact perforation exposing a predetermined area of said first upper conductor surface; and a second conductor layer overlying said second upper insulator surface, said recessed surface, and said predetermined area, said second conductor layer comprising a primary conductor film having a primary upper surface, a secondary conductor film having a secondary upper surface, and a ternary conductor film, said primary conductor film overlying said second upper insulator surface, said secondary conductor film overlying said predetermined area, said recessed surface, and said primary upper surface, said secondary conductor film being brought into contact with said predetermined area, said ternary conductor film overlying said secondary upper surface, said primary conductor film having a primary resistance value, said secondary conductor film having a secondary resistance value which is lower than said primary resistance value.

2. A semiconductor device as claimed in claim 1, wherein said secondary conductor film is made of a member selected from platinum, palladium, platinum alloy, and palladium alloy.

3. A semiconductor device as claimed in claim 2, wherein said primary conductor film is made of at least one member selected from titanium, tungsten, and titanium nitride.

4. A semiconductor device as claimed in claim 2, wherein said ternary conductor film is made of a member selected from gold and gold alloy.

5. A semiconductor device as claimed in claim 4, wherein said primary conductor film is made of a silicide of at least one member selected from titanium, tungsten, and titanium nitride.

6. A semiconductor device as claimed in claim 2, wherein said primary conductor film is made of at least one member selected from titanium, tungsten, and titanium nitride.

7. A semiconductor device as claimed in claim 2, wherein said primary conductor film is made of a silicide of at least one member selected from titanium, tungsten, and titanium nitride.

8. A semiconductor device as claimed in claim 1, wherein said ternary conductor film is made of a member selected from gold and gold alloy.

9. A semiconductor device as claimed in claim 8, wherein said primary conductor film is made of at least one member selected from titanium, tungsten, and titanium nitride.

10. A semiconductor device as claimed in claim 8, wherein said primary conductor film is made of a silicide of at least one member selected from titanium, tungsten, and titanium nitride.

11. A semiconductor device as claimed in claim 1, wherein said primary conductor film is made of at least one member selected from titanium, tungsten, and titanium nitride.

12. A semiconductor device as claimed in claim 1, wherein said primary conductor film is made of a silicide of at least one member selected from titanium, tungsten, and titanium nitride.

13. A semiconductor device comprising:

a semiconductor substrate having a principal surface;

a first insulator layer overlying said principal surface and having a first upper insulator surface;

a first conductor layer overlying said first upper insulator surface and having a first upper conductor surface leaving a surrounding area of said first upper insulator surface exposed;

a second insulator layer overlying said first upper conductor surface and said surrounding area of the first upper insulator surface and having a second upper insulator surface, said second insulator layer having a first recessed surface which defines a first contact perforation exposing a predetermined area of said first upper conductor surface; and a second conductor layer overlying said second upper insulator surface, said first recessed surface, and said predetermined area, said second conductor layer comprising a primary conductor film having a primary upper surface, a secondary conductor film having a secondary upper surface, and a ternary conductor film, said primary conductor film overlying said second upper insulator surface, said primary conductor film further having a second recessed surface which defines a second contact perforation exposing said predetermined area in combination with said first contact perforation, said secondary conductor film overlying said predetermined area, said first and said second recessed surfaces, and said primary upper surface, said secondary conductor film being brought into contact with said predetermined area, said ternary conductor film overlying said secondary upper surface, said primary conductor film having a primary resistance value, said secondary conductor :film having a secondary resistance value which is lower than said primary resistance value.

14. A semiconductor device as claimed in claim 13, said second recessed surface having an upper part surface which reaches to said second upper insulator surface, said primary conductor film further overlying said upper part surface.

* * * * *